(12) United States Patent
Zhu et al.

(10) Patent No.: US 8,928,089 B2
(45) Date of Patent: Jan. 6, 2015

(54) SEMICONDUCTOR STRUCTURE AND METHOD FOR FORMING THE SAME

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics Chinese Academy of Sciences, Beijing (CN)

( * ) Notice: Subject to any disclaimer, the term of this patent is extended or adjusted under 35 U.S.C. 154(b) by 301 days.

(21) Appl. No.: 13/201,827

(22) PCT Filed: Feb. 24, 2011

(86) PCT No.: PCT/CN2011/071249

§ 371 (c)(1),
(2), (4) Date: Aug. 16, 2011

(87) PCT Pub. No.: WO2011/143961

PCT Pub. Date: Nov. 24, 2011

(65) Prior Publication Data

US 2011/0316088 A1 Dec. 29, 2011

(30) Foreign Application Priority Data

May 20, 2010 (CN) .......................... 2010 1 0185025

(51) Int. Cl.
*H01L 21/70* (2006.01)
*H01L 21/8238* (2006.01)
*H01L 29/78* (2006.01)

(52) U.S. Cl.
CPC *H01L 21/823807* (2013.01); *H01L 21/823864* (2013.01); *H01L 29/7843* (2013.01)
USPC ...................................................... 257/369

(58) Field of Classification Search
None
See application file for complete search history.

(56) References Cited

U.S. PATENT DOCUMENTS

| 7,045,408 | B2 * | 5/2006 | Hoffmann et al. | 438/199 |
| 7,615,434 | B2 * | 11/2009 | Sun et al. | 438/199 |
| 8,338,919 | B2 * | 12/2012 | Satoh | 257/649 |
| 2007/0120197 | A1 * | 5/2007 | Zhu et al. | 257/369 |
| 2007/0200179 | A1 | 8/2007 | Chen | |
| 2007/0243686 | A1 * | 10/2007 | Chen et al. | 438/301 |
| 2007/0257336 | A1 * | 11/2007 | Matsumoto | 257/627 |
| 2008/0026523 | A1 * | 1/2008 | Lee et al. | 438/231 |
| 2008/0073713 | A1 | 3/2008 | Kim et al. | |
| 2008/0164531 | A1 | 7/2008 | Jawarani et al. | |
| 2008/0169510 | A1 | 7/2008 | Kumar et al. | |
| 2008/0173950 | A1 | 7/2008 | Zhu et al. | |
| 2009/0309163 | A1 | 12/2009 | Wang et al. | |

FOREIGN PATENT DOCUMENTS

| CN | 101026162 A | 8/2007 |
| CN | 101226900 A | 7/2008 |

* cited by examiner

*Primary Examiner* — Benjamin Sandvik
(74) *Attorney, Agent, or Firm* — Goodwin Procter LLP

(57) ABSTRACT

A semiconductor structure and a method for forming the same are provided. The structure comprises a semiconductor substrate (100) with an nMOSFET region (102) and a pMOSFET region (104) on it. An nMOSFET structure and a pMOSFET structure are formed in the nMOSFET region (102) and the pMOSFET region (104), respectively. The nMOSFET structure comprises a first channel region (182) formed in the nMOSFET region (102) and a first gate stack formed in the first channel region (182). The nMOSFET structure is covered with a compressive-stressed material layer (130) to apply a tensile stress to the first channel region (182). The pMOSFET structure comprises a second channel region (184) formed in the pMOSFET region (104) and a second gate stack formed in the second channel region (184). The pMOSFET structure is covered with a tensile-stressed material layer (140) to apply a compressive stress to the second channel region (184).

16 Claims, 7 Drawing Sheets

US 8,928,089 B2

SEMICONDUCTOR STRUCTURE AND METHOD FOR FORMING THE SAME

This application is a National Phase application of, and claims priority to, PCT Application No. PCT/CN2011/071249 filed on Feb. 24, 2011, entitled "SEMICONDUCTOR STRUCTURE AND METHOD FOR FORMING THE SAME," which claims priority to Chinese patent application No. 201010185025.5 filed on May 20, 2010. Both the PCT Application and Chinese Application are incorporated herein by reference in their entireties.

FIELD OF THE INVENTION

The present invention relates to the field of semiconductor manufacturing, and particularly to a semiconductor structure and a method for forming the same.

BACKGROUND OF THE INVENTION

With the developments of semiconductor technology, requirements for feature size and performance of CMOS (Complementary Metal-Oxide Semiconductor) devices are increasing. Device performance can be improved by using a strained channel in the MOSFET (Metal-Oxide-Semiconductor Field Effect Transistor). However, with the increase of density of ICs (Integrated circuits) and decrease of pitches, it is difficult to provide sufficient stress by the strained channel in order to meet the device performance requirement. U.S. patent application US20090309163(A1)-2009-12-17 discloses a method in which stresses in the channels of different devices are adjusted by forming a pMOSFET and an nMOSFET with different heights in a CMOS structure. However, this method requires forming gate stacks with different heights, and the stress obtained in the channel region under a relatively higher gate stack is still not sufficient.

SUMMARY OF THE INVENTION

An objective of the present invention is to solve at least one of the technical problems above, especially to solve the problem of insufficient stress in the channel due to shrinking device size.

To achieve the objective above, in one aspect, the present invention provides a semiconductor structure, including: a semiconductor substrate, and an nMOSFET region and a pMOSFET region formed on the semiconductor substrate, wherein an nMOSFET structure and a pMOSFET structure are formed in the nMOSFET region and pMOSFET region, respectively, and wherein the nMOSFET structure comprises: a first channel region formed in the nMOSFET region; and a first gate stack formed in the first channel region, wherein the nMOSFET structure is covered with a compressive-stressed material layer to apply a tensile stress to the first channel region; and the pMOSFET structure comprises: a second channel region formed in the pMOSFET region; and a second gate stack formed in the second channel region, wherein the pMOSFET structure is covered with a tensile-stressed material layer to apply a compressive stress to the second channel region.

In another aspect, the present invention provides a method for forming the semiconductor structure above, including the following steps: providing a semiconductor substrate; electrically isolating an nMOSFET region and a pMOSFET region in the semiconductor substrate; forming an nMOSFET structure in the nMOSFET region, wherein the nMOSFET structure comprises a first gate stack and a first channel region under the first gate stack; forming a pMOSFET structure in the pMOSFET region, wherein the pMOSFET structure comprises a second gate stack and a second channel region under the second gate stack; forming a compressive-stressed material layer to cover the nMOSFET structure, so as to apply a tensile stress to the first channel region; and forming a tensile-stressed material layer to cover the pMOSFET structure, so as to apply a compressive stress to the second channel region.

By covering an nMOSFET structure with a compressive-stressed layer to provide tensile stress for the nMOSFET channel and covering the pMOSFET structure with a tensile-stressed layer to provide compressive stress for the pMOSFET channel, an embodiment of the present invention can improve device performance of the MOSFET when its size is scaled down.

Additional aspects and advantages of the present invention will be given hereinafter, some of which will be apparent from the following description, or known from the practice of the present invention.

BRIEF DESCRIPTION OF THE DRAWINGS

The above and other objectives, features and advantages will be more apparent with reference to the accompanying drawings. In the drawings, the same reference numerals indicate the same parts. The accompanying drawings may not be drawn to scale, so as not to unnecessarily obscure the embodiments of the present invention.

DETAILED DESCRIPTION OF THE INVENTION

Figure 1:
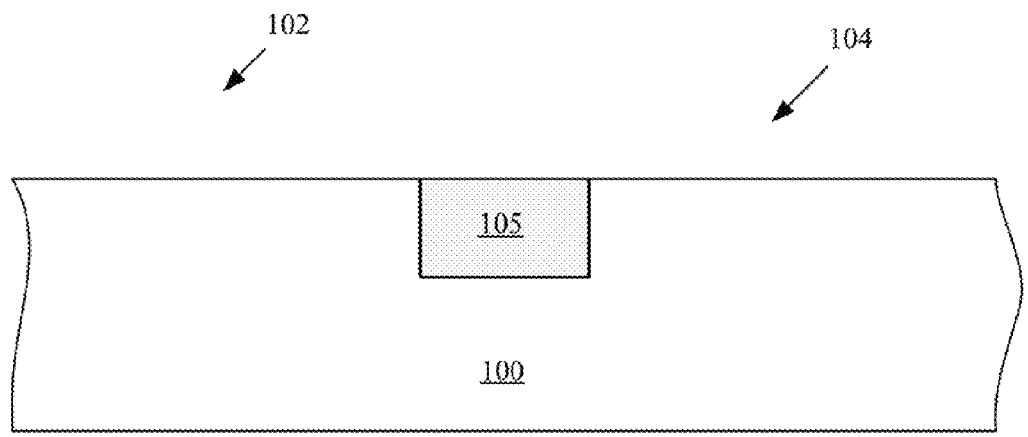
FIGS. 1-12 are structural cross-sectional views in respective steps of a method for forming a semiconductor structure according to an embodiment of the present invention.

The above objectives, features and advantages of the present invention will be more apparent when read in conjunction with the accompanying drawings and the following description of the embodiments of the present invention.

Various embodiments or examples implementing different structures of the present invention are disclosed herein. Specific components and arrangements of the embodiments are set forth, which are for illustrative purposes only rather than limiting the invention. Moreover, the same reference numerals and/or letters may be repeated in different embodiments of the present invention. This "repetition" is only for simplification and clarity, and does not suggest any relationship between the embodiments and/or arrangements. Furthermore, specific technical processes and materials are set forth herein. However, it will be apparent to those skilled in the art that the embodiments of the present invention can be practiced without these specific details. In addition, the structure described herein in which a first feature being over/on a second feature may comprise an embodiment where the first feature and the second feature are in direct contact, or may also comprise an embodiment where other features are formed between the first feature and the second feature so that the first feature and the second feature are not in direct contact.

FIGS. 1-12 are structural cross-sectional views in respective steps of a method for forming a semiconductor structure according to an embodiment of the present invention. The method for forming a semiconductor device according to the embodiment of the present invention and the formed semiconductor structure are described below with reference to the accompanying drawings.

As shown in FIG. 1, a semiconductor substrate 100 is provided, and the semiconductor substrate 100 is separated into an nMOSFET region 102 and a pMOSFET region 104 by an isolation region 105. The isolation region 105 may be a shallow trench isolation (STI) structure.

Figure 2:
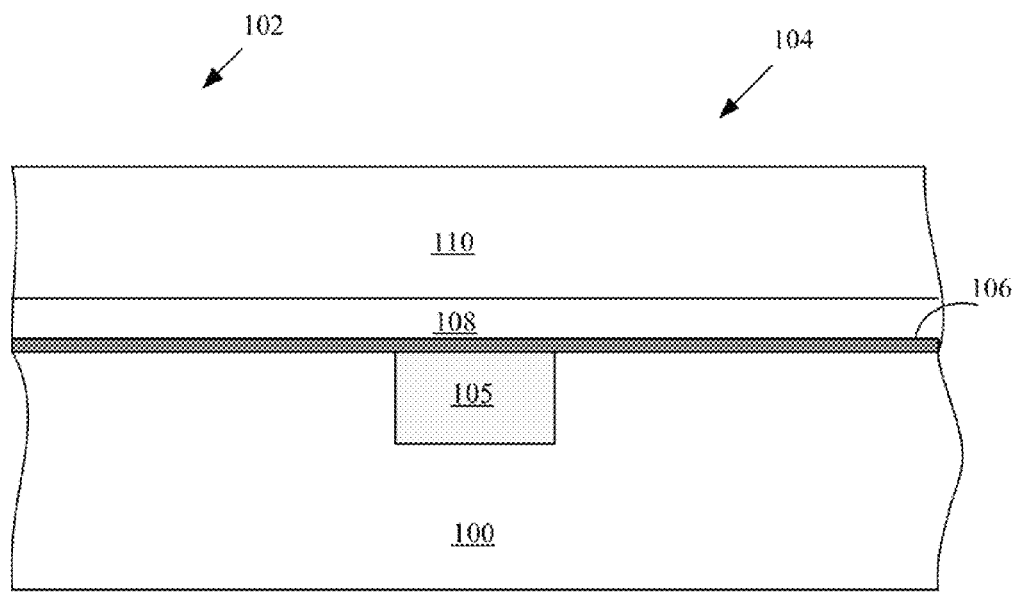

Then, an nMOSFET structure is formed in the nMOSFET region, and a pMOSFET structure is formed in the pMOSFET region. As shown in FIG. 2, a gate dielectric layer 106 is formed on the semiconductor substrate 100 by thermal oxidation or deposition. As an example, the gate dielectric layer 106 may be a high-K gate dielectric layer or a conventional $SiO_2$ layer having a thickness of about 1-3 nm. Then, a gate electrode main layer is formed on the gate dielectric layer 106. The gate electrode main layer may include a lower first conducting layer 108 and an upper second conducting layer 110. In an embodiment of the present invention, the gate electrode may have a conventional structure. Preferably, the first conducting layer 108 may have a thickness of about 10-30 nm and may be formed of polysilicon, W, Ta, SiGe or other conductive materials, and the second conducting layer 110 may have a thickness of about 70-90 nm and may be formed of polysilicon or polysilicon-germanium.

Figure 3:
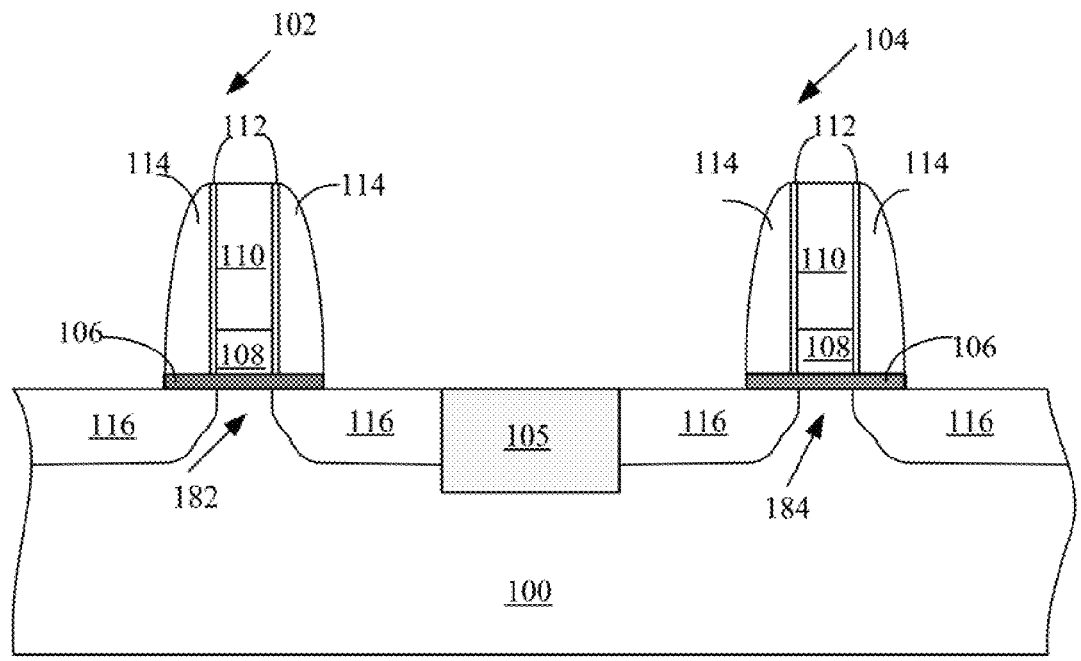

As shown in FIG. 3, an nMOSFET structure and a pMOSFET structure are formed. Specifically, for example, first a gate stack structure is formed by etching. More specifically, for example, a photoresist layer is patterned with a pattern of the gate stack, and the second conducting layer 110 is etched downwards to form the gate stack.

Then, light doping can be performed to source/drain regions.

Then, a dielectric layer having a thickness of about 3-10 nm, normally $SiO_2$, is deposited on the whole semiconductor structure, and is selectively etched by RIE (Reactive-Ion Etching) so as to form a first spacer 112 shown in FIG. 3. The first spacer 112 can serve as a protective layer for the gate electrode main layer. Next, an insulating material layer having a thickness of about 5-30 nm, e.g. $Si_3N_4$, is deposited on the whole semiconductor structure, and is further etched to form a second spacer 114 shown in FIG. 3. Now, a gate stack structure has been formed. The gate stack structure comprises the gate dielectric layer 106 at the bottom, the first conducting layer 108 (e.g., a metal layer) on the gate dielectric layer 106, the second conducting layer 110 (e.g., a polysilicon layer) on the first conducting layer 108, and the first spacer 112 and the second spacer 114 on both sides of the gate stack.

When the spacers have been formed, doping is performed to form source/drain regions 116, and a first channel region 182 and a second channel region 184 are formed between the source/drain regions.

Figure 4:
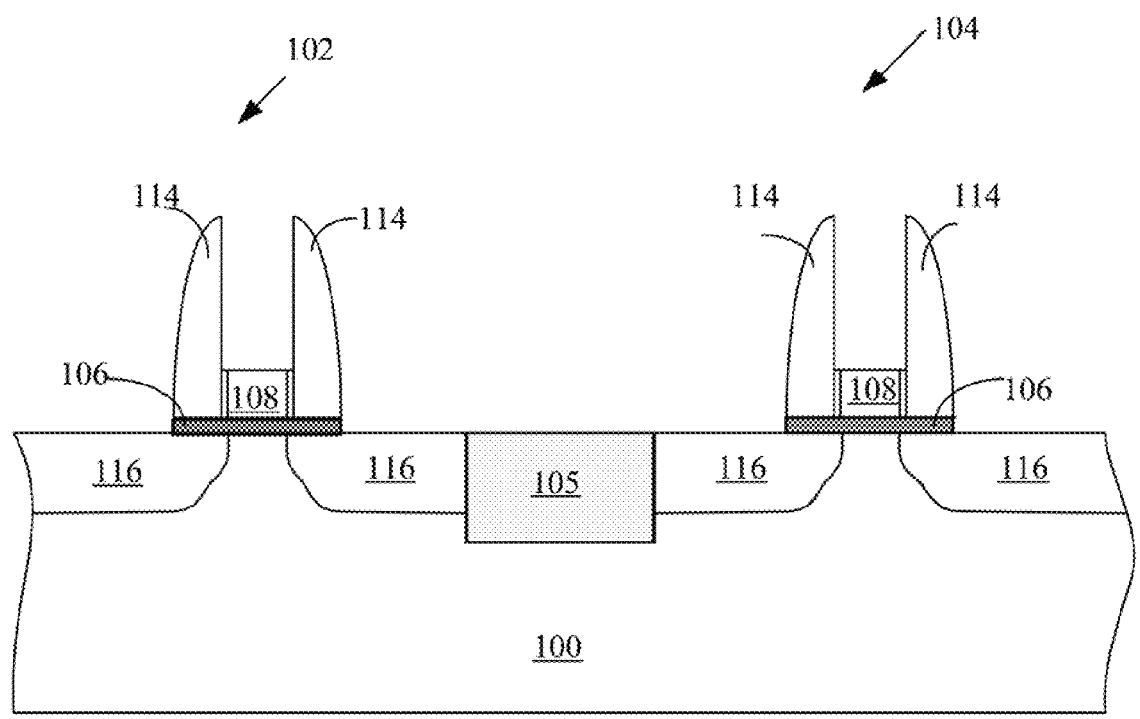

Then, as shown in FIG. 4, the second conducting layer 110 on the nMOSFET structure and the pMOSFET structure is selectively etched, and then a portion of the first spacer 112 that is located above the first conducting layer 108 is etched by a wet etching method with HF solution. Since the first spacer 112 has a small thickness, the effect of the etching process on the isolation region 105 may be negligible.

Figure 5:
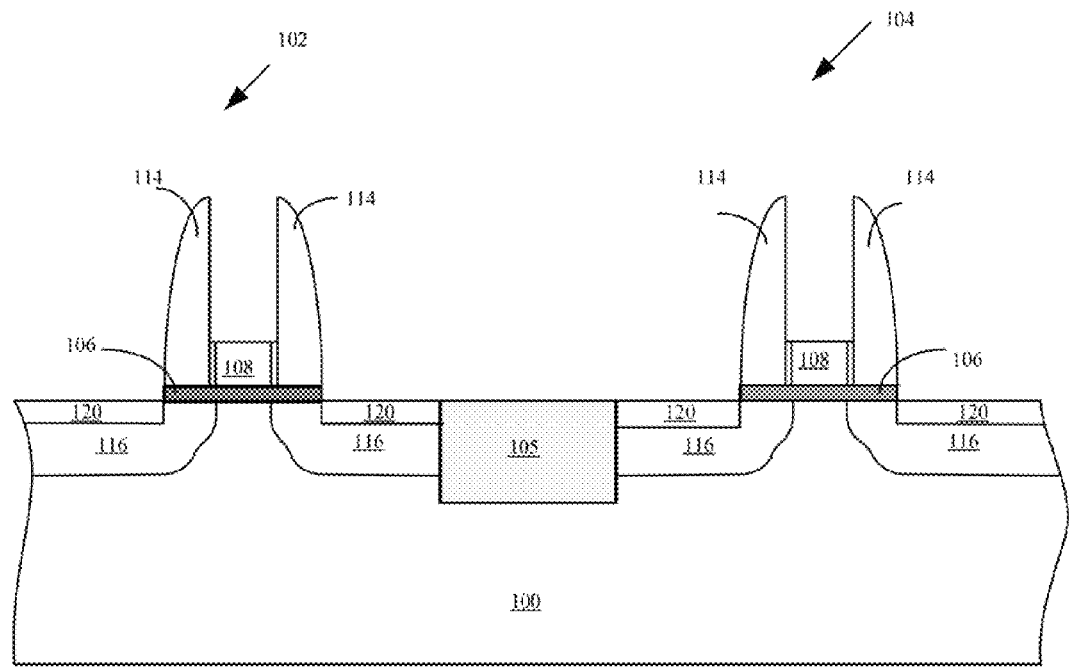

Then, metal silicide may be formed. For example, a layer of metal having a thickness of about 3-20 nm, preferably Ni, may be deposited on the whole semiconductor structure, and then annealing may be performed at an annealing temperature of about 300-500° C. for about 1-60 s, so as to form metal silicide 120 on the source/drain region 116 and on the first conducting layer 108, as shown in FIG. 5. The metal silicide 120 on the first conducting layer 108 is not shown in FIG. 5.

Figure 6:
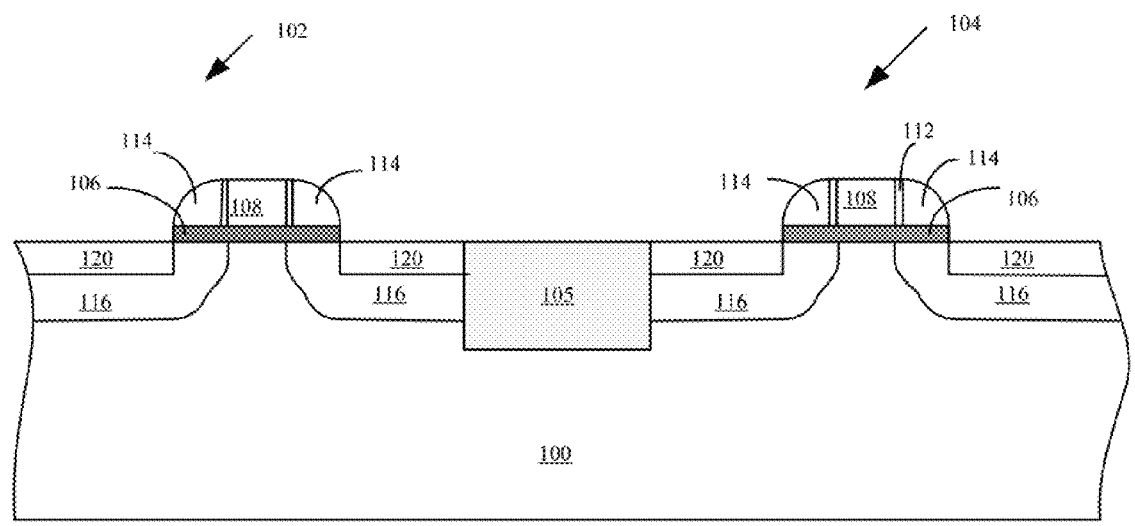

As shown in FIG. 6, the second spacer 114 is further etched, for example, by a wet or dry etching method, such that the second spacer 114 is flushed with the first conducting layer 108 and the first spacer 112, thereby forming a gate stack structure having a height of about 25-50 nm in the embodiment of the present invention.

The steps for forming a compressive-stressed material over the nMOSFET structure and a tensile-stressed material over the pMOSFET structure are given below.

Figure 7:
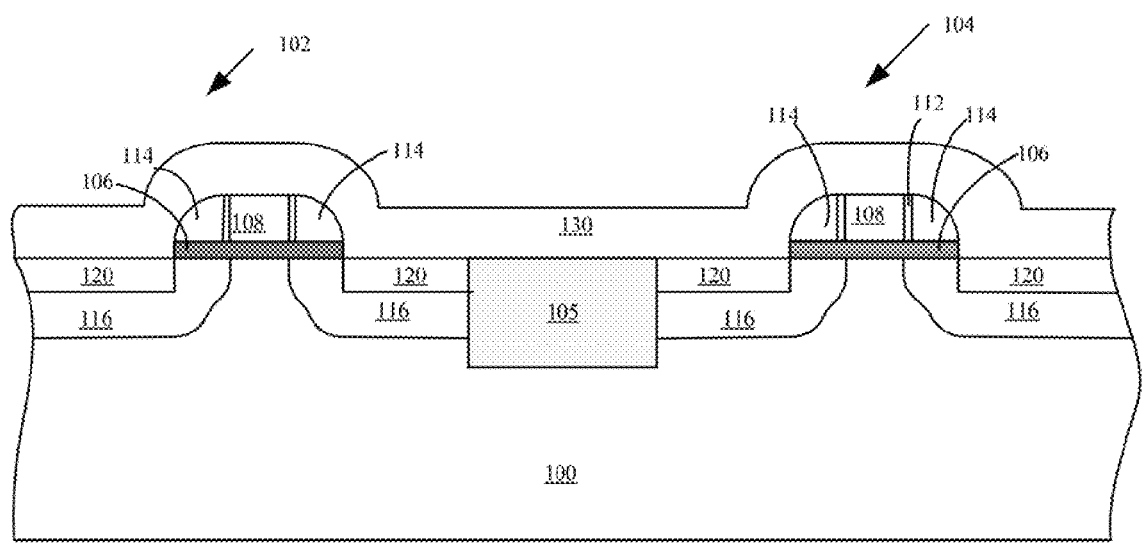

First, as shown in FIG. 7, a compressive-stressed layer 130 having a thickness of approximately 40-100 nm is formed on the whole semiconductor structure. The compressive-stressed layer 130 may be formed by HDP (High-Density Plasma) deposition or PECVD (Plasma-enhanced chemical vapor deposition) deposition, for example, with $SiH_4/NH_3/N_2$ at about 200-500° C.

Figure 8:
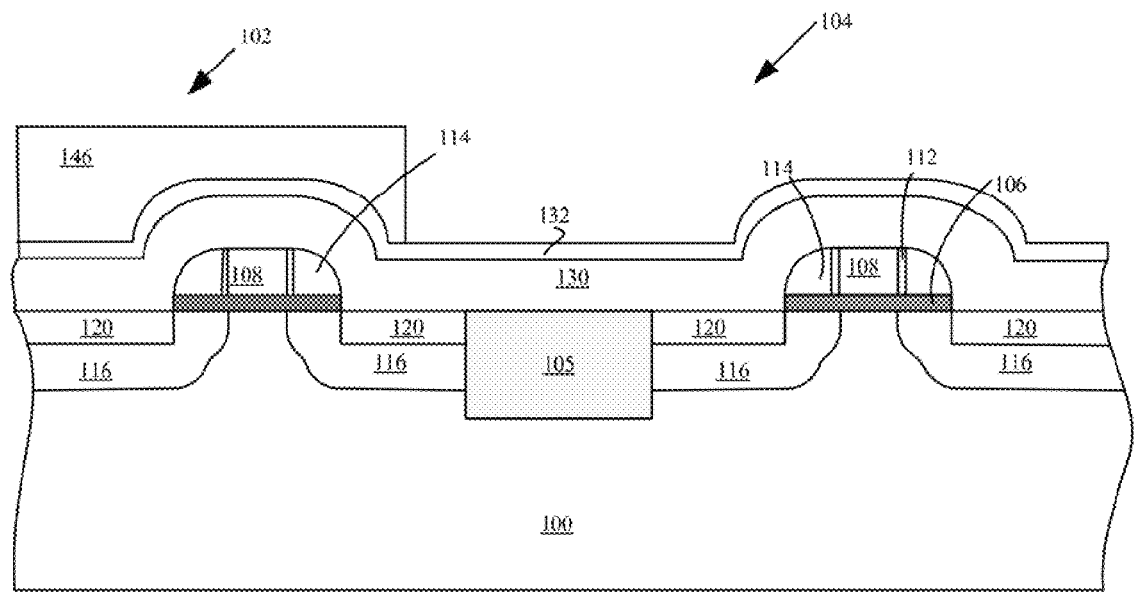

Then, as shown in FIG. 8, a layer of oxide 132, e.g. $SiO_2$, is formed on the compressive-stressed layer 130, by a conventional deposition method. A photoresist layer 146 is used to protect the nMOSFET region. Preferably, the coverage of the photoresist layer does not extend beyond the nMOSFET region on the left, e.g., as shown in FIG. 8, does not extend beyond the source/drain regions 116 between the first channel region 182 and the pMOSFET region 104.

Figure 9:
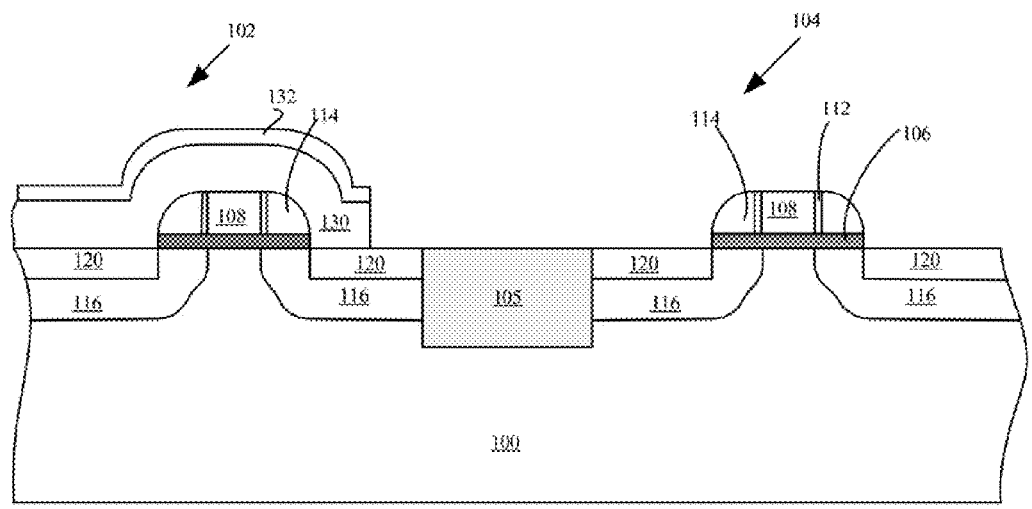

As shown in FIG. 9, the portions of the compressive-stressed layer 130 and of the oxide layer 132 that are not protected by the photoresist layer are etched such that the pMOSFET structure is exposed.

Figure 10:
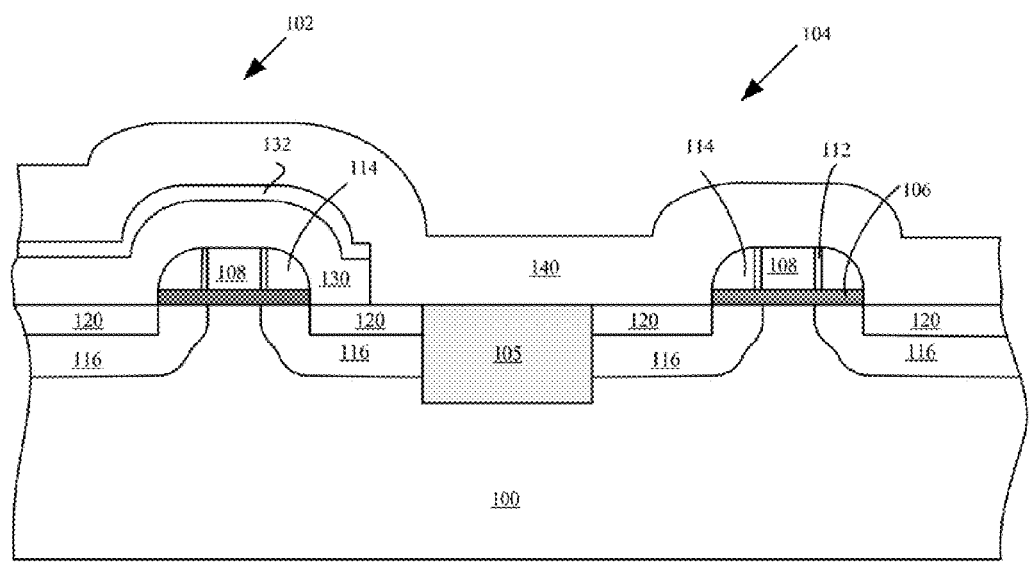

As shown in FIG. 10, further, a tensile-stressed layer 140 is formed on the whole semiconductor structure by a method which may be referenced to the method above for forming the compressive-stressed layer 130. The compressive-stressed material 130 and the tensile-stressed material 140 may be low-K materials including any one or combinations of: SiCOH, SiO and SiCO.

Figure 11:
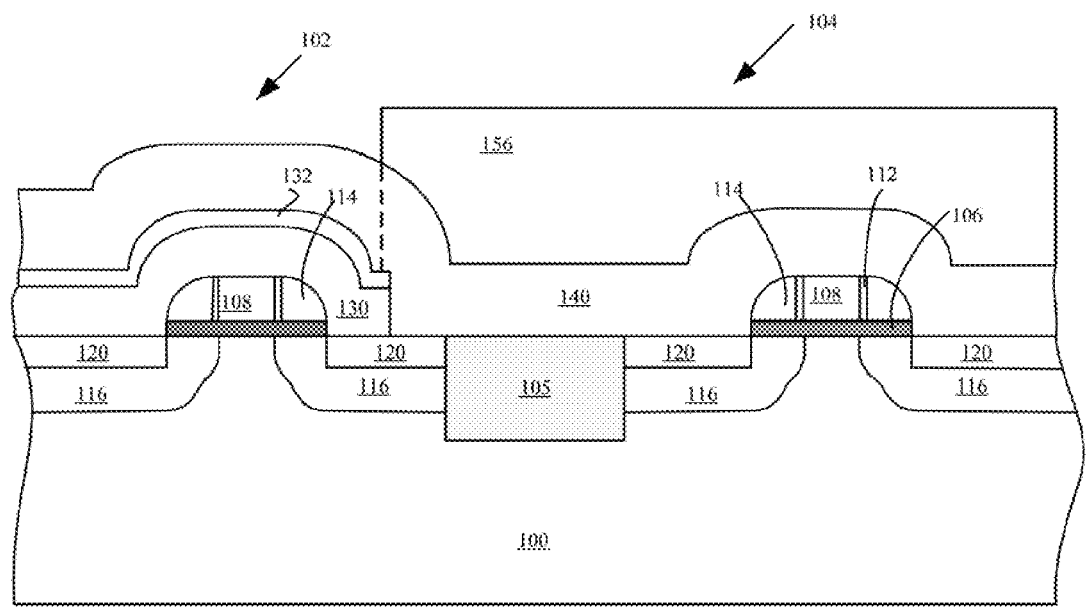

As shown in FIG. 11, the pMOSFET region is covered with a photoresist layer 156, and the coverage extends to the nMOSFET region. For example, the photoresist layer 156 may cover the region which is not covered by photoresist layer 146 in FIG. 8, and may extend beyond the etching interface of the compressive-stressed material as appropriate.

Figure 12:
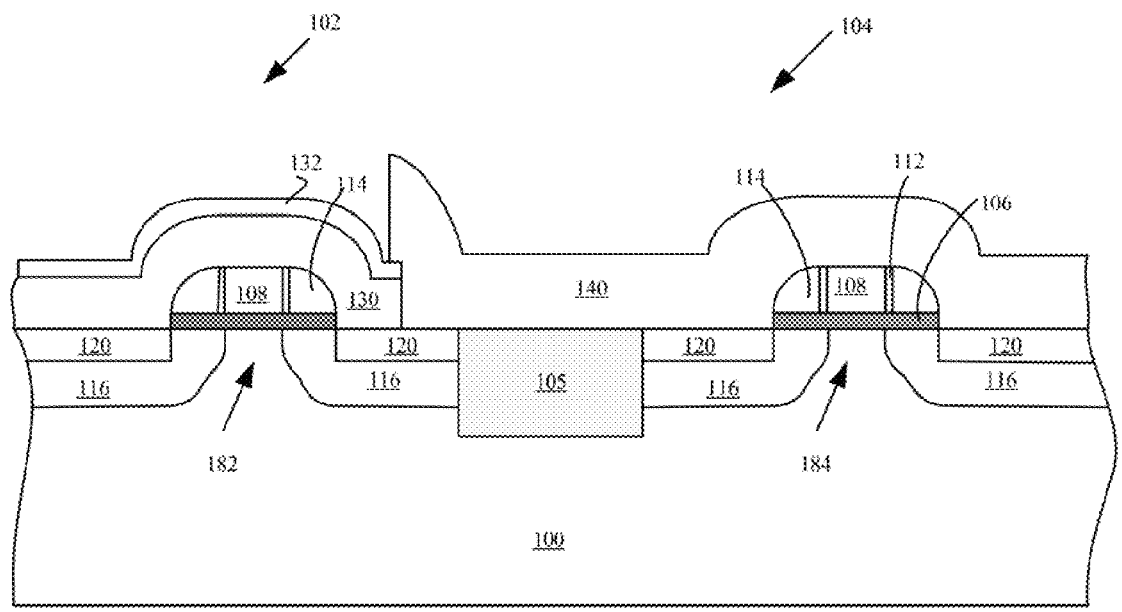

As shown in FIG. 12, the tensile-stressed material layer 140 over the nMOSFET region is etched by using the photoresist layer 156 as a mask to expose the oxide layer 132 serving as an etching-stop layer. It should be noted that, in etching, a portion of the tensile-stressed material 140 over the contact interface between the compressive-stressed layer 130 and the tensile-stressed layer 140 is retained such that the tensile-stressed material 140 covers the compressive-stressed material 130 over the contact interface, thereby ensuring generation of interacting compressive stress and tensile stress at the contact interface.

Now, the semiconductor structure according to the embodiment of the present invention is obtained. As shown in FIG. 12, the semiconductor structure comprises a semiconductor substrate 100, and an nMOSFET region 102 and a pMOSFET region 104 formed on the semiconductor substrate 100. An nMOSFET structure and a pMOSFET structure separated by an isolation region 105 are formed in the nMOSFET region 102 and the pMOSFET region 104, respectively.

The nMOSFET structure comprises: a first channel region 182 formed in the nMOSFET region; and a first gate stack formed over the first channel region 182, wherein the nMOSFET structure is covered with a compressive-stressed material 130 to apply a tensile stress to the first channel region 182.

The pMOSFET structure comprises: a second channel region 184 formed in the pMOSFET region; and a second gate stack formed over the second channel region 184, wherein the pMOSFET is covered with a tensile-stressed material 140 to apply a compressive stress to the second channel region 184.

Preferably, the first gate stack and the second gate stack may have a height of about 25-50 nm. The contact interface between the compressive-stressed material 130 and the tensile-stressed material 140 is farther away from the second gate stack than from the first gate stack.

Preferably, the distance between the first gate stack and the contact interface is less than 200 nm; and the distance between the second gate stack and the contact interface is less than 200 nm.

Preferably, the contact interface is in a region between the first channel region 182 and the pMOSFET region 104, for example, in the source/drain region 116 between the nMOSFET structure and the adjacent pMOSFET structure. Specifically, the tensile-stressed material 140 covers the compressive-stressed material 130 over the contact interface between the compressive-stressed material 130 and the tensile-stressed material 140.

In the embodiment of the present invention, the first gate stack and the second gate stack have a small height. For example, for the nMOSFET structure, a compressive-stressed material layer is deposited on it. Since the gate electrode has a small height, the compressive stress caused by the compressive-stressed material may apply a sufficient tensile stress to both sides of the first channel region 182, and the tensile stress may be further applied to the pMOSFET region on the right, so that the second channel region 184 in the pMOSFET region is subjected to a compressive stress. Similarly, for the pMOSFET structure, the tensile-stressed material deposited on it may apply a sufficient compressive stress to both sides of the second channel region 184.

In an embodiment of the present invention, the compressive-stressed material 130 and the tensile-stressed material 140 may be low-K materials, including any one or combinations of SiCOH, SiO, and SiCO.

In other embodiments of the present invention, the tensile-stressed material layer over the pMOSFET structure may be formed before formation of the compressive-stressed material layer over the nMOSFET structure. Specifically, the method may comprise: forming an nMOSFET structure and a pMOSFET structure over the nMOSFET region and the pMOSFET region, respectively, wherein the channel region of the nMOSFET is a first channel region, and the channel region of the pMOSFET is a second channel region; depositing a tensile-stressed material and an etching protective layer on the semiconductor substrate and etching the etching protective layer and the tensile-stressed material over the nMOSFET structure; and depositing a compressive-stressed material on the semiconductor substrate, and etching the compressive-stressed material over the pMOSFET structure to stop at the etching protective layer.

Particularly, in etching the etching protective layer and the tensile-stressed material over the nMOSFET structure, the etched area does not extend beyond the region between the first channel region and the adjacent pMOSFET region, such that the distance between the first gate stack and the eventual contact interface between the compressive-stressed material and the tensile-stressed material is less than the distance between the second gate stack and the contact interface.

Figure 13:
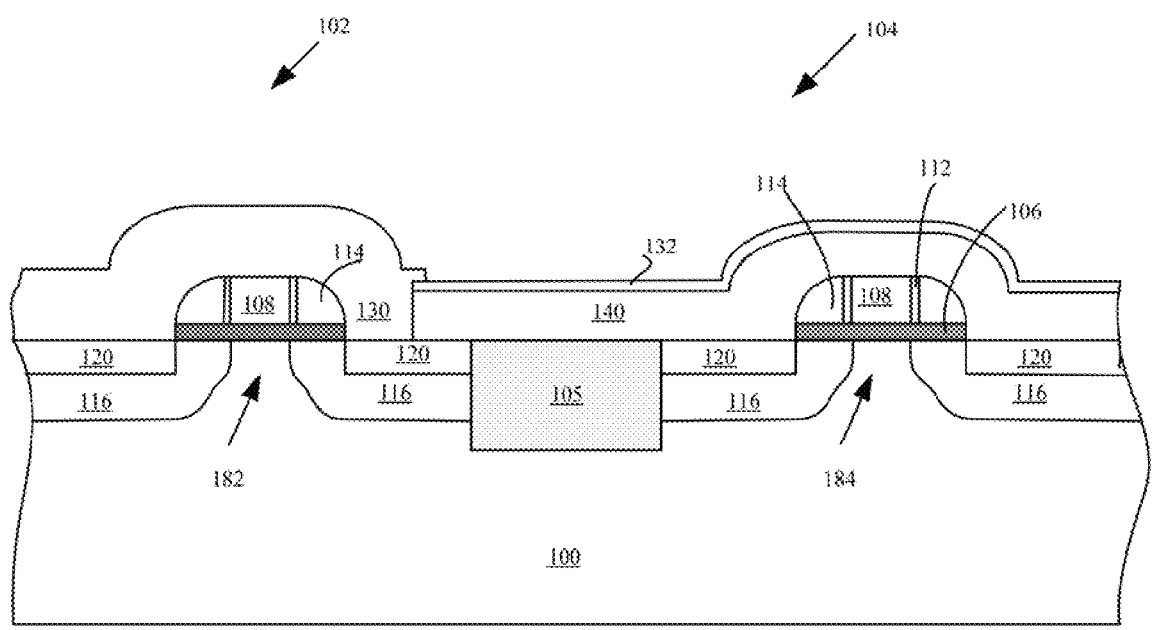
FIG. 13 illustrates a cross-sectional view of a semiconductor structure formed according to another embodiment of the present invention.

Particularly, in etching the compressive-stressed material over the pMOSFET structure, a portion of the compressive-stressed material is retained over the contact interface between the compressive-stressed material and the tensile-stressed material, such that the compressive-stressed material covers the tensile-stressed material. In this way, another semiconductor structure is obtained by the method for forming a semiconductor structure according to another embodiment of the present invention. As shown in FIG. 13, in this semiconductor structure, the pMOSFET structure is covered with a tensile-stressed material 140, the tensile-stressed material is covered with an etch-stop layer 132, the nMOSFET structure is covered with a compressive-stressed material layer 130, and at the contact interface between the tensile-stressed material layer 140 and the compressive-stressed material layer 130, the compressive-stressed material layer covers the tensile-stressed material layer so that interacting stresses are generated at the contact interface.

In the embodiments of the present invention, by forming a compressive-stressed material layer over the nMOSFET structure to generate tensile stress at both ends of the channel and forming a tensile-stressed material layer over the pMOSFET structure to generate compressive stress at both ends of the channel, and by utilizing the edge effect between the compressive-stressed material and the tensile-stressed material to improve channel stress, carrier mobility in the channel can be enhanced greatly, and device performance of the MOSFET can be improved when its size is scaled down.

Preferred embodiments of the present invention are disclosed above, which should not be interpreted as limiting the present invention. Numerous alternations, modifications, and equivalents can be made to the technical solution of the present invention by those skilled in the art in light of the methods and technical content disclosed herein without deviation from the scope of the present invention. Therefore, any alternations, modifications, and equivalents made to the embodiments above according to the technical essential of the present invention without deviation from the scope of the present invention should fall within the scope of protection of the present invention.

The embodiments of the present invention are described herein in a progressive manner, with the emphasis of each of the embodiments on the difference between it and the other embodiments; hence, for the same or similar parts between the embodiments, one can refer to the other embodiments. The description of the embodiments herein enables those skilled in the art to implement or use the present invention. Numerous modifications to the embodiments will be apparent to those skilled in the art, and the general principle herein can be implemented in other embodiments without deviation from the spirit or scope of the present invention. Therefore, the present invention will not be limited to the embodiments described herein, but in accordance with the widest scope consistent with the principle and novel features disclosed herein.

The invention claimed is:

1. A semiconductor structure, comprising:
   a semiconductor substrate, and an nMOSFET region and a pMOSFET region formed on the semiconductor substrate, wherein an nMOSFET structure and a pMOSFET structure are formed in the nMOSFET region and pMOSFET region, respectively, and wherein
   the nMOSFET structure comprises: a first channel region formed in the nMOSFET region, a first source/drain region located between the first channel region and the pMOSFET structure, and a first gate stack formed in the first channel region, wherein the nMOSFET structure is covered with a compressive-stressed material layer to apply a tensile stress to the first channel region; and
   the pMOSFET structure comprises: a second channel region formed in the pMOSFET region; and a second gate stack formed in the second channel region, wherein the pMOSFET structure is covered with a tensile-stressed material layer to apply a compressive stress to the second channel region, wherein the compressive-stressed material layer contacts the tensile-stressed material layer, the contact interface between the compressive-stressed material layer and the tensile-stressed material layer is farther away from the second gate stack than from the first gate stack, and the contact interface is formed in a region above the first source/drain region.

2. The semiconductor structure according to claim 1, wherein the first gate stack and the second gate stack have a height of about 25-50 nm.

3. The semiconductor structure according to claim 1, wherein the distance between the first gate stack and the contact interface is less than 200 nm.

4. The semiconductor structure according to claim 1, wherein the distance between the second gate stack and the contact interface is less than 200 nm.

5. The semiconductor structure according to claim 1, wherein the contact interface is located in a region between the first channel region and the pMOSFET region.

6. The semiconductor structure according to claim 1, wherein the compressive-stressed material layer and the tensile-stressed material layer are made of low-K materials.

7. The semiconductor structure according to claim 1, wherein, over the contact interface between the compressive-stressed material layer and the tensile-stressed material layer, the tensile-stressed material layer covers the compressive-stressed material layer, or the compressive-stressed material layer covers the tensile-stressed material layer.

8. A method for forming a semiconductor structure, comprising:
providing a semiconductor substrate;
electrically isolating an nMOSFET region and a pMOSFET region in the semiconductor substrate;
forming an nMOSFET structure in the nMOSFET region, wherein the nMOSFET structure comprises a first gate stack, a first source/drain region and a first channel region under the first gate stack, and the first gate stack comprises a first gate dielectric layer and a first gate electrode layer on the first the gate dielectric layer;
forming a pMOSFET structure in the pMOSFET region, wherein the pMOSFET structure comprises a second gate stack and a second channel region under the second gate stack, the second gate stack comprises a second gate dielectric layer and a second gate electrode layer on the second gate dielectric layer, and the first source/drain region is located between the first channel region and the pMOSFET structure;
forming a compressive-stressed material layer to cover the nMOSFET structure, so as to apply a tensile stress to the first channel region; and
forming a tensile-stressed material layer to cover the pMOSFET structure, so as to apply a compressive stress to the second channel region;
making the compressive-stressed material layer to contact the tensile-stressed material layer, wherein the contact interface between the compressive-stressed material layer and the tensile-stressed material layer is farther away from the second gate stack than from the first gate stack, and the contact interface is formed in a region above the first source/drain region.

9. The method according to claim 8, wherein after forming the first gate stack and the second gate stack, the method further comprises:

etching the first and second gate electrode layers of both the first gate stack and the second gate stack, such that the first gate stack and the second gate stack have a height of about 25-50 nm.

10. The method according to claim 9, wherein each of the first and second gate electrode layers comprises a lower conducting layer and an upper conducting layer, and
the etching of each of the first and second gate electrode layers of both the first gate stack and the second gate stack comprises: etching the upper conducting layer.

11. The method according to claim 8, wherein forming a compressive-stressed material layer to cover the first gate stack and forming a tensile-stressed material layer to cover the second gate stack comprise:
forming a compressive-stressed material layer and an etching protective layer on the semiconductor substrate;
etching the etching protective layer and the compressive-stressed material layer over the pMOSFET structure;
forming a tensile-stressed material layer on the semiconductor substrate; and
etching the tensile-stressed material layer over the nMOSFET structure to stop at the etch protective layer.

12. The method according to claim 11, wherein during etching the etch protective layer and the compressive-stressed material layer over the pMOSFET structure,
the etched area extends to a region between the first channel region and the adjacent pMOSFET, such that the contact interface between the compressive-stressed material layer and the tensile-stressed material layer is farther away from the second gate stack than from the first gate stack.

13. The method according to claim 11, wherein during etching the tensile-stressed material layer over the nMOSFET structure, a portion of the tensile-stressed material over the contact interface between the compressive-stressed material layer and the tensile-stressed material layer is retained, such that the tensile-stressed material layer covers the compressive-stressed material layer.

14. The method according to claim 8, wherein forming a compressive-stressed material layer to cover the first gate stack and forming a tensile-stressed material layer to cover the second gate stack comprise:
forming a tensile-stressed material layer and an etch protective layer on the semiconductor substrate;
etching the etching protective layer and the tensile-stressed material layer over the nMOSFET structure;
forming a compressive-stressed material layer on the semiconductor substrate; and
etching the compressive-stressed material layer over the pMOSFET structure to stop at the etching protective layer.

15. The method according to claim 14, wherein during etching the etching protective layer and the tensile-stressed material layer over the nMOSFET structure,
the etched area does not extend beyond a region between the first channel region and the adjacent pMOSFET region, such that the contact interface between the compressive-stressed material layer and the tensile-stressed material layer is farther away from the second gate stack than from the first gate stack.

16. The method according to claim 14, wherein during etching the compressive-stressed material layer over the pMOSFET structure, a portion of the compressive material over the contact interface between the compressive-stressed material layer and the tensile-stressed material layer is retained, such that the compressive-stressed material layer covers the tensile-stressed material layer.

* * * * *